US009806003B2

(12) United States Patent
Smalley et al.

(10) Patent No.: US 9,806,003 B2
(45) Date of Patent: Oct. 31, 2017

(54) SINGLE BASE MULTI-FLOATING SURFACE COOLING SOLUTION

(71) Applicant: Intel Corporation, Santa Clara, CA (US)

(72) Inventors: Jeffory L. Smalley, East Olympia, WA (US); Susan F. Smith, Olympia, WA (US); Thu Huynh, Portland, OR (US); Mani Prakash, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/197,129

(22) Filed: Jun. 29, 2016

(65) Prior Publication Data

US 2017/0221793 A1 Aug. 3, 2017

Related U.S. Application Data

(60) Provisional application No. 62/289,222, filed on Jan. 30, 2016.

(51) Int. Cl.
*H01L 23/42* (2006.01)
*H01L 25/00* (2006.01)
(Continued)

(52) U.S. Cl.
CPC ........ *H01L 23/427* (2013.01); *H01L 25/0655* (2013.01); *H01L 25/50* (2013.01);
(Continued)

(58) Field of Classification Search
CPC ... H01L 23/427; H01L 25/0655; H01L 25/50; H05K 1/0203; H05K 7/20336; H05K 7/20409

See application file for complete search history.

(56) References Cited

U.S. PATENT DOCUMENTS 5,608,610 A * 3/1997 Brzezinski .......... H01L 23/3675
257/713
6,519,154 B1 * 2/2003 Chiu ........................... 361/704
(Continued)

FOREIGN PATENT DOCUMENTS

KR 101504744 3/2015

OTHER PUBLICATIONS

Intel Corporation, "International Search Report and Written Opinion", PCT Application No. PCT/US2016/060341 (dated Mar. 6, 2017).

*Primary Examiner* — Ida M Soward
(74) *Attorney, Agent, or Firm* — Schwabe, Williamson & Wyatt P.C.

(57) ABSTRACT

An apparatus including a primary device and at least one secondary device coupled to a substrate; a heat exchanger disposed on the primary device and on the at least one secondary device, wherein the heat exchanger includes at least one portion disposed over an area corresponding to the primary device or the at least one second device including a deflectable surface; and at least one thermally conductive conduit coupled to the heat exchanger. A method including placing a heat exchanger on a multi-chip package, the heat exchanger including the heat exchanger including at least one floating section operable to move in a direction toward or away from at least one of the plurality of dice and at least one thermally conductive conduit disposed in a channel of the heat exchanger and connected to the at least one floating section; and coupling the heat exchanger to the multi-chip package.

14 Claims, 7 Drawing Sheets

(51) Int. Cl.
*H05K 1/02* (2006.01)
*H05K 7/20* (2006.01)
*H01L 23/427* (2006.01)
*H01L 25/065* (2006.01)

(52) U.S. Cl.
CPC ....... *H05K 1/0203* (2013.01); *H05K 7/20336* (2013.01); *H05K 7/20409* (2013.01); *H05K 2201/10522* (2013.01)

(56) References Cited

U.S. PATENT DOCUMENTS

| | | | |
|---|---|---|---|
| 7,885,067 B2* | 2/2011 | Sakata | 361/695 |
| 8,109,321 B2* | 2/2012 | Alousi et al. | 165/80.3 |
| 2002/0062648 A1* | 5/2002 | Ghoshal | 62/3.7 |
| 2006/0291172 A1* | 12/2006 | Lee et al. | 361/719 |
| 2007/0035931 A1* | 2/2007 | kuo et al. | 361/719 |
| 2007/0258213 A1* | 11/2007 | Chen et al. | 361/701 |
| 2008/0000087 A1* | 1/2008 | Kuczunski | 29/890.03 |
| 2008/0130239 A1 | 6/2008 | Liu et al. | |
| 2008/0158820 A1 | 7/2008 | Peng et al. | |
| 2009/0122480 A1 | 5/2009 | Chou et al. | |
| 2014/0069611 A1 | 3/2014 | Liu et al. | |
| 2015/0062820 A1* | 3/2015 | Lam | H01L 23/473 361/700 |
| 2015/0173243 A1* | 6/2015 | Chauhan | H05K 7/20336 165/104.26 |
| 2016/0118315 A1* | 4/2016 | Smith | H01L 23/3672 257/713 |
| 2016/0155682 A1* | 6/2016 | Ahuja | G06F 1/20 257/717 |
| 2016/0276243 A1* | 9/2016 | Smalley | H01L 23/3677 |

* cited by examiner

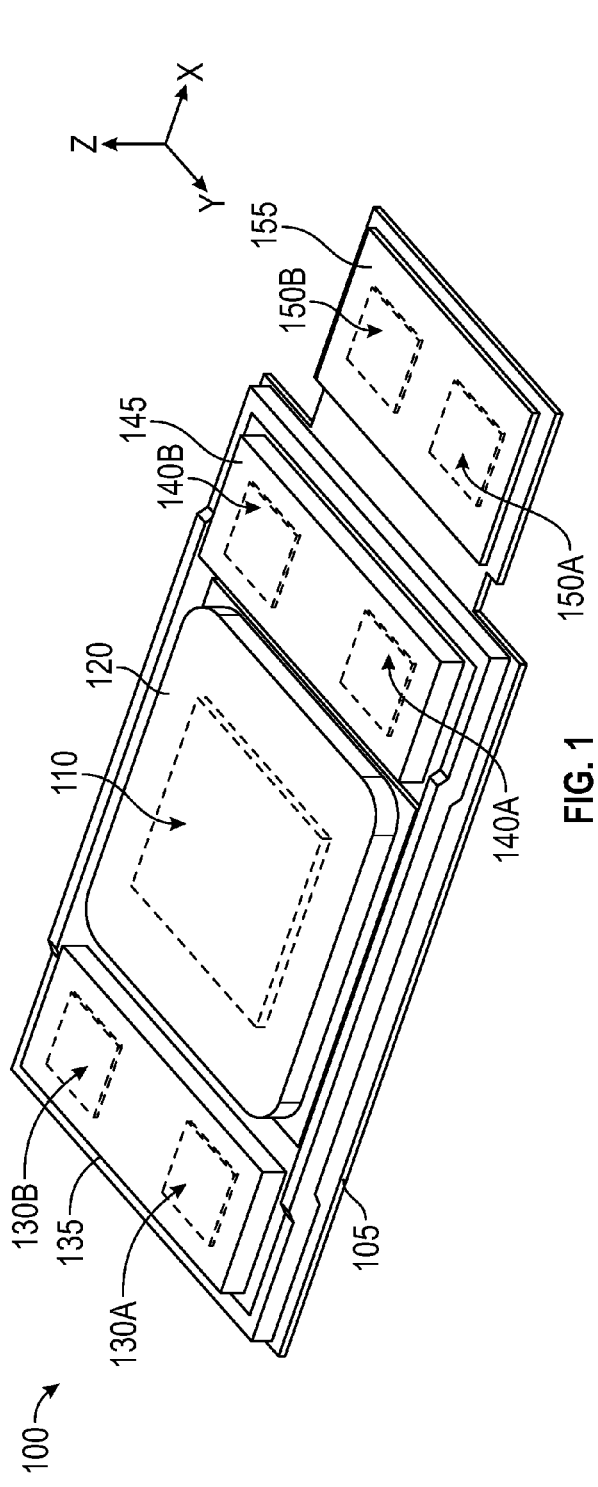
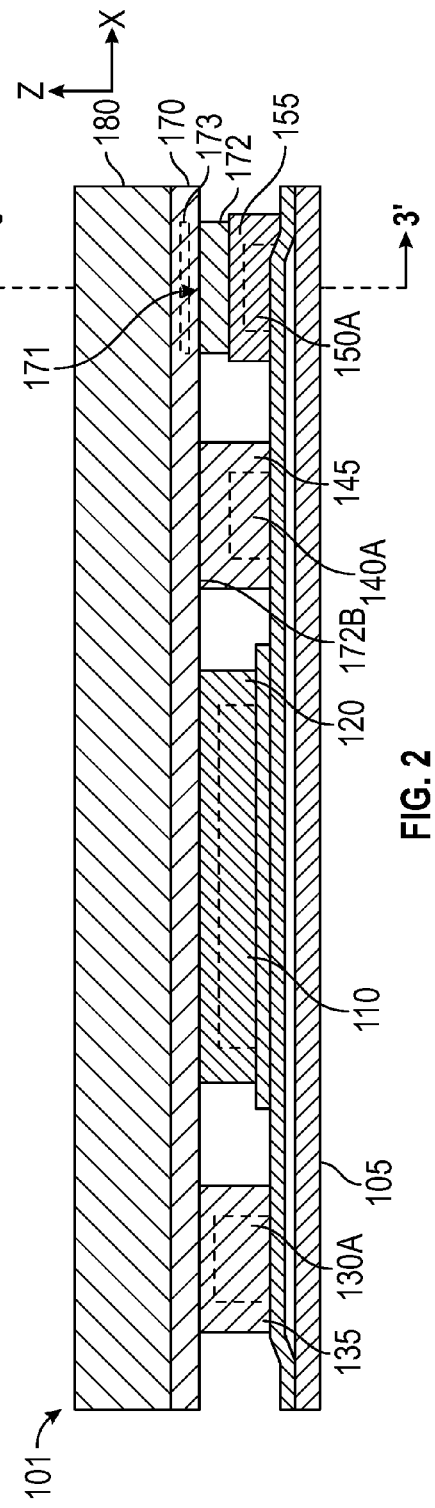

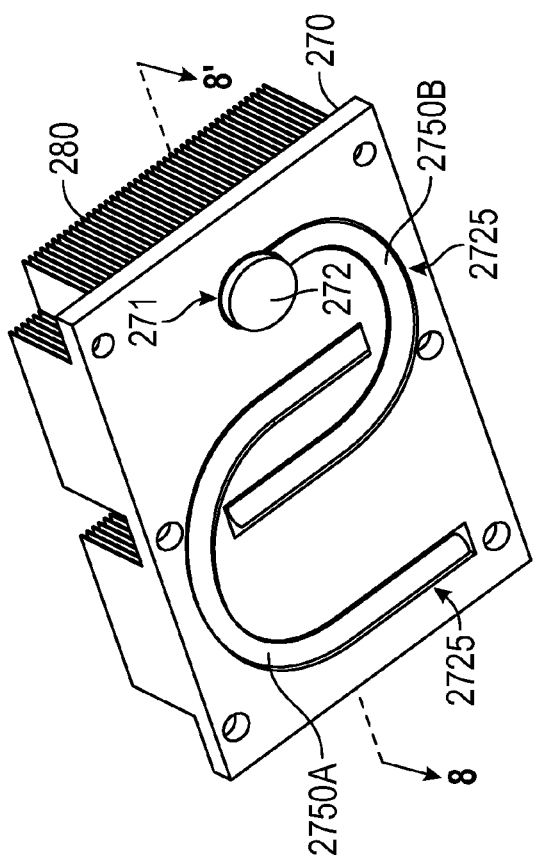
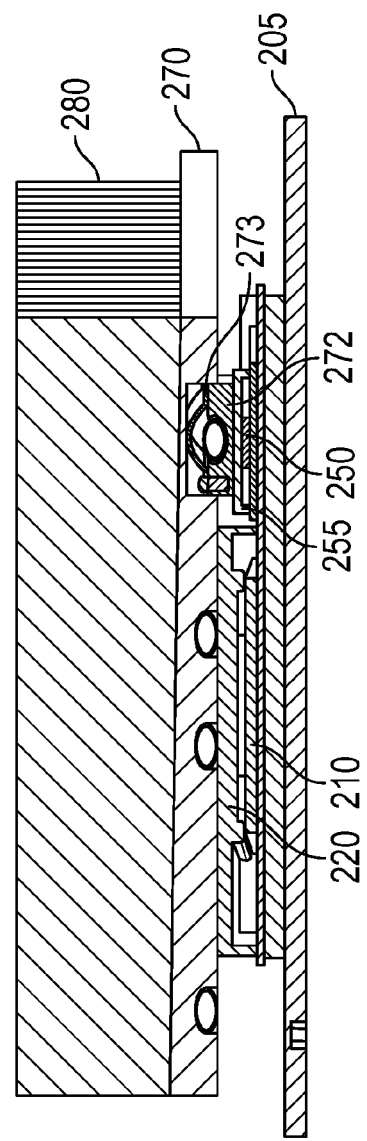
FIG. 7
FIG. 8

SINGLE BASE MULTI-FLOATING SURFACE COOLING SOLUTION

CROSS-REFERENCE TO RELATED APPLICATION

The application claims the benefit of the earlier filing date of co-pending U.S. Provisional Patent Application No. 62/289,222, filed Jan. 30, 2016 and incorporated herein by reference.

BACKGROUND

The disclosure generally relates to the field of integrated circuit (IC) devices and, more particularly, to techniques and configurations for heat removal from multi-chip packages or a portion, including an entire portion, of a motherboard using a heat exchanger (e.g., a heat sink) and thermal conduits, such as a heat pipe or thermally conductive rod for multi-surface components.

BRIEF DESCRIPTION OF THE DRAWINGS

FIG. 1 shows a top side perspective view of an embodiment of a multi-chip central processing unit (CPU) package.

FIG. 2 shows a side view of an assembly including the multi-chip package of FIG. 1 having a heat sink thereon.

FIG. 7 shows a bottom perspective view of an embodiment of a heat sink operable for connection to the multi-chip package of FIG. 6.

FIG. 8 shows a cross-section of the assembly of the package of FIG. 6 and the heat sink of FIG. 7 through line 8-8' of FIG. 7.

DETAILED DESCRIPTION

Figure 3:
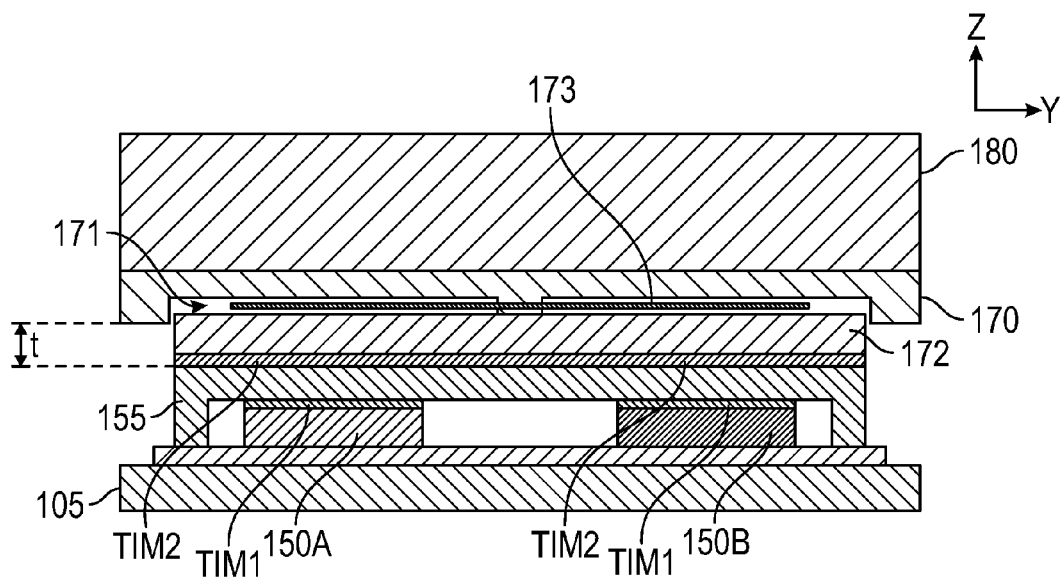
FIG. 3 shows a cross-section through line 3-3' of FIG. 2.

IC technology companies may be developing more integrated multi-chip products consisting of, for example, processor, memory and companion chips. Packaging can consist of a single IHS (Integrated Heat Spreader) over all the components or individual IHSs for each component. FIG. 1 shows a top side perspective view of a generic multi-chip central processing unit (CPU) package. Package 100 includes die 110 disposed on processor substrate 105 (e.g., a circuit board). Overlying die 110 is IHS 120 with a thermal interface material (TIM) there between (TIM1). In this exemplary embodiment, package 100 also includes secondary devices of, for example, memory chip 130A, memory chip 130B, memory chip 140A, memory chip 140B, as well as companion chip 150A and companion chip 150B that are, for example, each a processor. It is appreciated that the secondary devices as memory chips and companion chips are one example. In another embodiment, other types of devices can be present in the package. Each of the primary device (die 110) and the secondary devices (memory chips 130A/B, 140A/B, and companion chips 150A/B) are connected in a planar array to substrate 105. In one embodiment, a thickness (z-dimension) of one or more of the secondary devices is different than a thickness (z-dimension) of die 110. In one embodiment, one or more of the secondary devices has a z-dimension thickness that is less than a thickness of die 110. In another embodiment, a z-dimension thickness of one or more secondary devices is different from die 110 and one or more other secondary devices.

In one embodiment, overlying each secondary device is an IHS with a respective TIM1 therebetween. In this embodiment, one IHS overlies two secondary devices. FIG. 1 shows IHS 135 on memory chip 130A and on memory chip 130B; IHS 145 on memory chip 140A and on memory chip 140B; and IHS 155 on companion chip 150A and on companion chip 150B. In another embodiment, adjacent secondary devices may have an individual IHS (not shared). In one embodiment, TIM1 is consistently thin or effectively minimal between each IHS and its respective device to improve the thermal performance between each heat generating component and a cooling solution and thus minimize the temperature of each component. In one embodiment, a suitable TIM1 is a polymer TIM with a standard thickness. In a further embodiment, an IHS may not be present on or over die 110 or one or more of the secondary devices.

In some solutions, the emphasis is on the thermal improvements which can be achieved from a junction of a component or device to the cooling solution base such as the base of an air-cooled heat sink. FIG. 2 shows a side view of an assembly including the multi-chip package of FIG. 1. Referring to FIG. 2, assembly 101 includes a cooling solution that, in this embodiment, is a passive heat exchanger that is a heat sink including heat sink base 170 and fins 180. The heat sink includes an xy area dimension that, in one embodiment, is similar to multi-chip package 100 and is disposed over an area portion of multi-chip package 100 including heat generating devices (e.g., an area including the primary device and secondary devices). FIG. 2 shows the heat sink over or on CPU die 110 and IHS 120 with heat sink base 170 justified to IHS 120. Heat sink base 170 is justified to IHS 120 in the sense that it is in physical contact with the IHS or in contact with a TIM2 material disposed on a surface of IHS 120 to a minimum effective thickness for such material.

In one embodiment, the heat sink includes one single or indivisible heat sink base (base 170) and one single or indivisible fin structure (fins 180). In one embodiment where one or more secondary devices and corresponding IHS are at a different z-height then primary device (die 110) and its IHS (IHS 120), portions of base 170 may include cavities for heat sink base portions and associated springs to compensate for a difference in z-height. FIG. 2 shows the heat sink including heat sink base 170 and fins 180 also includes a cavity or cavities over areas corresponding to ones of the secondary devices of multi-chip package 100, notably, in this example, companion chips 150A and 150B. Disposed within such cavities are heat sink base portions that are deflectable portions (deflectable in a z-direction). FIG. 2 shows second heat sink base portion 172 disposed over or on IHS 155 on companion chip 150A and companion chip 150B. In one embodiment, cavity 171 does not extend through heat sink base 170. In another embodiment, cavities may extend through the base in the form of openings.

The introduction of a cooling solution on multi-chip package may include coupling of self-adjusting heat sink surfaces to multi-surface height components to minimize both TIM1 (between the die and IHS) and TIM2 (between the IHS and cooling solution base) and may result in significant increased thermal performance and opportunities. FIG. 3 shows a cross-section through line 3-3' of FIG. 2. FIG. 3 illustrates TIM1 between each of chip 150A and chip 150B and IHS 155. FIG. 3 also illustrates heat sink base 170 and fins 180 on or over IHS 155. In this embodiment, heat sink base 170 includes cavity 171 over an area corresponding to IHS 155. Disposed within cavity 171 of heat sink base 170 is heat sink base portion 172. Heat sink base portion 172 is biased away from heat sink base 170 by spring 173 in the cavity (between heat sink base 170 and heat sink base portion 172).

In the embodiment illustrated in FIGS. 1-3, primary die 110 and IHS 120 have a greater z-height than a z-height of secondary device 150A and secondary device 150B with their corresponding IHS (IHS 155). Because heat sink base 170 is justified to IHS 120, there is a gap defined by a thickness, t, between a surface of heat sink base 170 and a top surface of IHS 155. In order to minimize a TIM2 thickness between the heat sink and IHS 155, heat sink base portion 172, because it floats (i.e., can move in a z-direction) in cavity 171 and is biased away from heat sink base 170 by spring 173, heat sink portion 172 extends a distance below (as viewed) a base of heat sink base 170 equivalent to at least a portion of the gap defined by thickness, t. In one embodiment, heat sink base portion 172 extends a distance below a base of heat sink base 170 to minimize a TIM2 thickness. FIG. 3 shows TIM2 between heat sink base portion 172 and IHS 155. It is appreciated that a secondary device and associated IHS, if present on the secondary device, in certain embodiments may have a z-height greater than a z-height of primary die 110 and IHS 120. In that instance, a heat sink base portion will be recessed in a cavity of the heat sink base so that surface operable to contact the secondary device or IHS (if present), is within the cavity. In another embodiment, the heat sink base may be justified to the secondary device and its associated IHS (if present) and the deflectable or floating heat sink base portion may be positioned in an area corresponding to the primary device (e.g., die 110).

Figure 4:
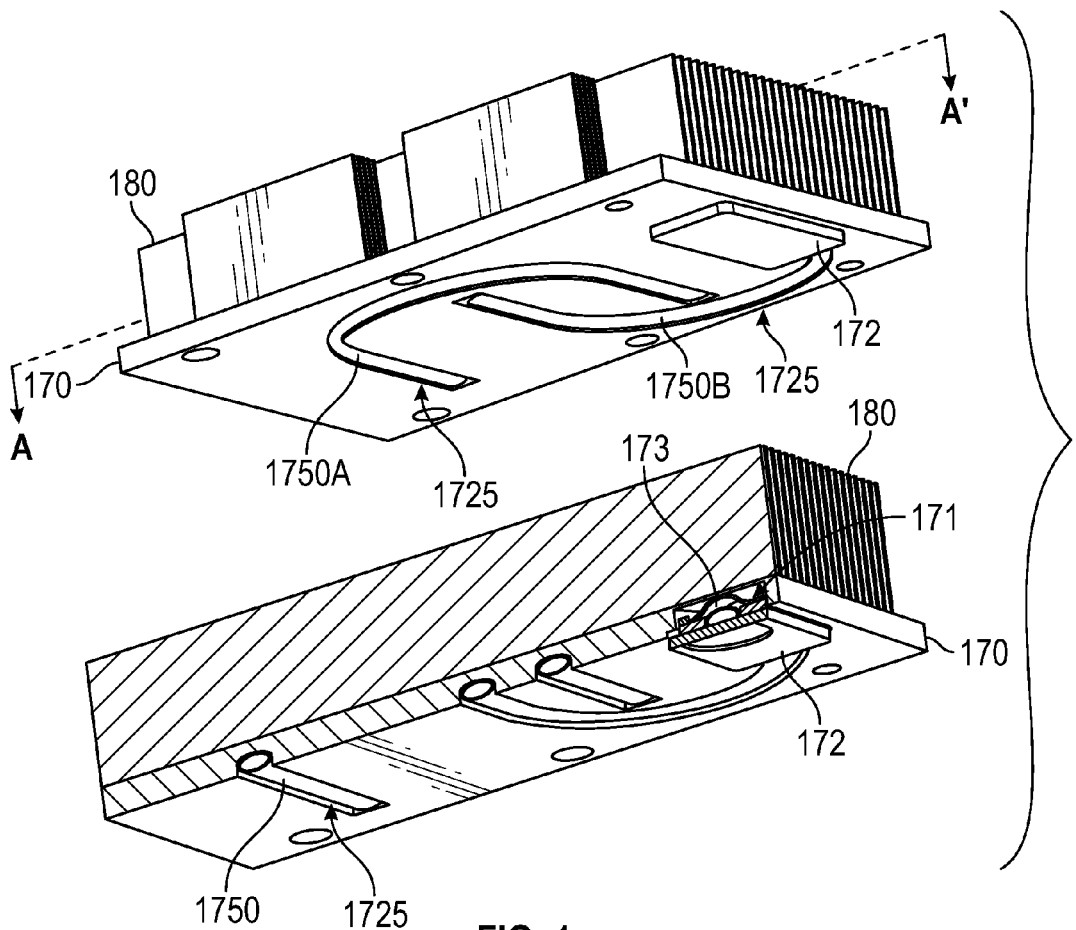
FIG. 4 shows a bottom side perspective view of the heat sink of FIG. 2 and a portion of the heat sink through line A-A'.

FIG. 4 shows a bottom perspective view of the heat sink of FIG. 2 including heat sink base 170 and heat sink fins 180. In a lower portion of the figure, a portion of the heat sink is shown bisected through line A-A'. FIG. 4 shows heat sink base 170 and fins 180 and illustrates heat sink base portion 172 positioned in cavity 171 in an area of heat sink base 170 corresponding to where the heat sink (heat sink base 170 and fins 180) is located over companion chip 150A and companion chip 150B, respectively. In one embodiment where other secondary devices (e.g., memory chip 130A, 130B, 140A, 140B) and their corresponding IHS are at a different z height than a z height of processor 110 and IHS 120, additional heat sink base portions may be positioned in cavities in heat sink base 170 in areas corresponding to the secondary device. FIG. 4 shows spring 173 disposed in cavity 171 between heat sink base 170 and heat sink base portion 172 with spring 173 biasing the heat sink base portion away from heat sink base 170. Internal spring 173 provides a force on the floating heat transfer surface that is adequate to control a thin TIM2 bond line (or TIM1 if IHS is not present). The spring reaction force is transferred back into heat sink base 170.

Figure 5:
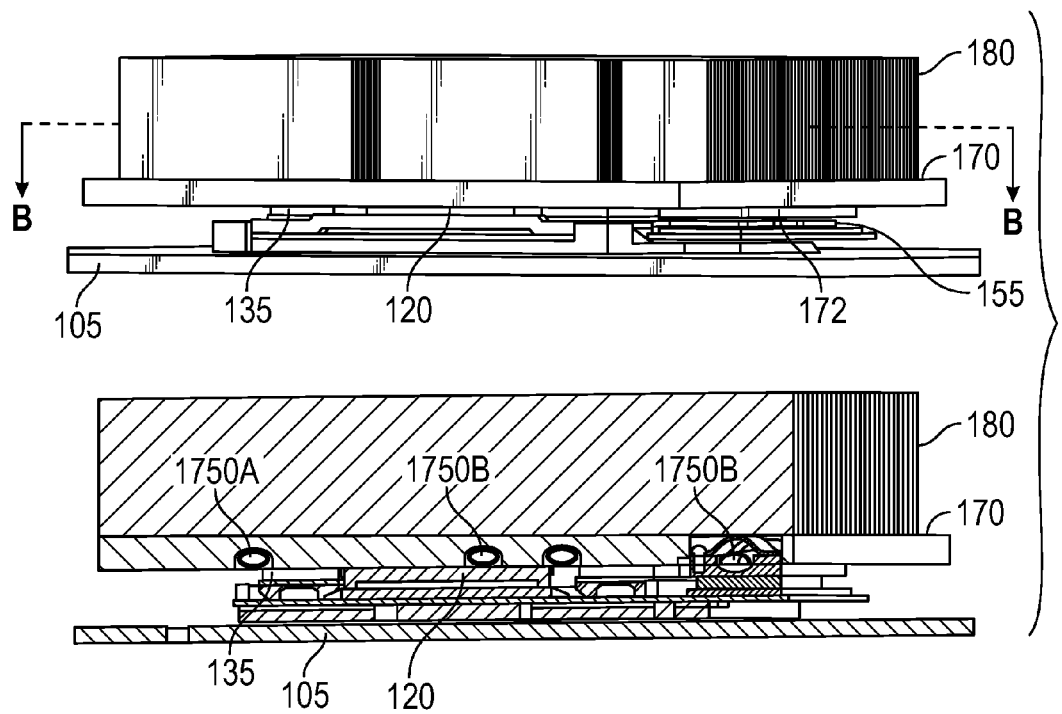
FIG. 5 shows a side perspective view of the assembly of FIG. 2 and a portion of the assembly through line B-B'.

FIG. 4 shows heat sink base 170 has a first side on which fins 180 are disposed. In this embodiment, on an opposite second side, heat sink base 170 includes cavity 171 to contain heat sink base portion 172 over an area corresponding to secondary devices on substrate 105 (see FIGS. 1-3). Heat sink portion 170 also includes channels 1725 (two channels) formed therein to contain one or more thermally conductive conduits, such as one or more heat pipes or thermally conductive rods (e.g., a metal rod (e.g., a copper rod) or composite rod). For purposes of this discussion, a thermally conductive conduit of a heat pipe is described. It is appreciated that other thermally conductive conduits could be substituted for a heat pipe. Referring to FIG. 4, in one embodiment, one or more heat pipes are positioned or nested in channels 1725 of heat sink base 170 heat pipes are positioned completely in respective channels so that a surface of heat sink base 170 is defined by a surface of the base and not a heat pipe protruding from a channel. In one embodiment, FIG. 4 shows heat pipe 1750A and heat pipe 1750B positioned in respective channels 1725 of heat sink base 170. Heat pipe 1750A is positioned in an area corresponding to an area of package 100 including die 110 and ones of the secondary devices (e.g., memory chip 130A, memory chip 130B, memory chip 140A, memory chip 140B). FIG. 4 shows heat pipe 1750B positioned in a channel in an area corresponding to an area of package 100 including companion chips 150A and 150B and secondary chips 140A/140B and die 110. Channel 1725 in which heat pipe 1750B is disposed extends to cavity 171. Heat pipe 1750B is connected to heat sink base portion 172 (so that the heat pipe is between heat sink base portion 172 and heat sink base 170) and therefore floats to the extent heat sink base portion 172 moves up or down. In one embodiment, there are three parts to heat pipe 1750B. One section of the heat pipe (e.g., a first end) is directly positioned in a channel and attached (e.g., soldered into heat sink base 170); another section (e.g., a middle section) is positioned in channel 1725 but not attached to heat sink base 170; and a third section is connected to heat sink base portion 172 as the floating heat transfer surface. This approach secures the position of the heat transfer surface in an xy plane. A z-dimension of heat sink base portion 172 is determined by internal spring 173 when the heat sink is installed on the package assembly as shown in FIG. 5. FIG. 5 shows a side perspective view of the assembly of FIG. 2 with a lower portion showing a cross-section through line B-B'. As shown in FIG. 5, heat pipe 1750B is at a first z-height in an area of heat sink base 170 approximately corresponding to an area of die 110 of package 100 and at a second z-height (lower) in an area where the pipe is connected to heat sink base portion 172.

Heat is removed from the companion chips by conduction through the TIM2 and floating heat transfer surface (including heat sink base portion 172) and into heat pipe 1750B. Heat pipe 1750B then transfers the heat into the single base heat sink (into heat sink base 170 and fins 180). As described above, in one embodiment, heat pipe 1750B has a section that is not directly attached to heat sink base 170 and provides the float required for the heat transfer surface. This section is malleable and allows for the vertical motion of the floating heat transfer surface. The travel distance of the floating surface is extremely minimal from a mechanical perspective and will not impact the reliability of the heat pipe. A representative travel distance is on the order of 0.125 millimeter (mm) to 0.500 mm.

In one embodiment, each of heat pipes 1750A and 1750B contains a fluid. A material for each of heat pipes 1750A-1750B is selected for a working temperature range of interest and fluid compatibility. Examples of material include copper with water as the fluid and aluminum with ammonia as the fluid. Other materials may be selected for other fluids (e.g., helium, mercury sodium). Each of heat pipes 1750A-1750B, in one embodiment, also contains a wicking material therein. A representative diameter range for heat pipes 1750A-1750B is 0.5 millimeters (mm) to 20 mm. A representative example diameter is on the order of 6 mm. A cross-sectional shape of a heat pipe may be circular, oval, rectangular, or other shape.

Figure 6:
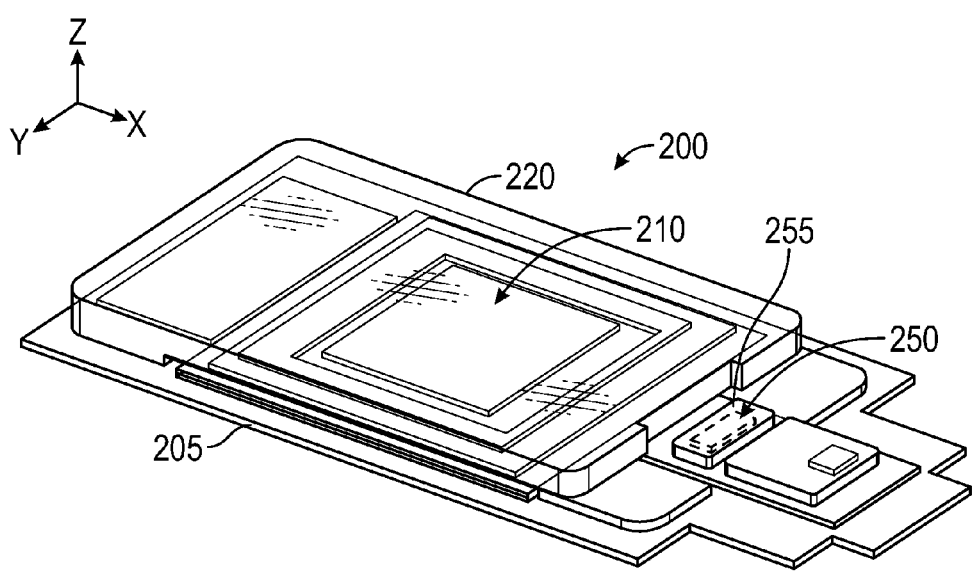
FIG. 6 shows a top side perspective view of another embodiment of a multi-chip package.

FIGS. 6-8 show another embodiment of an assembly including a multi-chip package and a heat sink. FIG. 6 shows a top side perspective view of another embodiment of a multi-chip package. Package 200 includes die 210 disposed on processor substrate 205. Overlying die 210 is IHS 220 with TIM1 between the device and the IHS. In this embodiment, package 200 also includes companion chip 250 as a secondary device having IHS 255 disposed thereon with a TIM1 between the device and the IHS. In this embodiment, companion chip 250 and its associated IHS 255 have a different z-height or z-dimension thickness than a z-dimension thickness of die 210 and its associated IHS 220.

FIG. 7 shows a bottom perspective view of a heat sink that, in one embodiment, includes an xy area dimension that, in one embodiment, is similar to package 200. The heat sink, in this embodiment, includes one single or individual heat sink base (base 270) and one single or indivisible fin structure (fins 280). FIG. 8 shows a cross-section of an assembly including package 200 with the heat sink of FIG. 7 thereon. The cross-section of the heat sink is taken through line 8-8' of FIG. 7.

In one embodiment, a heat sink (heat sink base 270 and fins 280) is justified to IHS 220 on die 210 of multi-chip package 200. As noted above, companion chip 250 and its associated IHS has a different z-height than a z-height of die 210 and IHS 220. As illustrated, the z-height of companion chip 250 and IHS 255 is less than a z-height of die 210 and IHS 220. Accordingly, heat sink base 270 includes cavity 271 disposed through a backside of the heat sink base (a side opposite fins 280) and heat sink base portion 272 disposed in cavity 271 and biased from heat sink base by spring 273 (see FIG. 8). FIG. 7 also shows channels 2725 (two channels) formed in heat sink base 270. Disposed within respective channels 2725 are heat pipe 2750A and heat pipe 2750B. In this example, heat pipe 2750A is positioned in channel 2725 in an area corresponding to an area of package 200 including die 210. Heat pipe 2750B is positioned in an area corresponding to an area of package 200 including companion chip 250. Heat pipe 2750B is connected to heat sink base portion 272 and therefore floats to the extent the heat sink base portion moves in a z-direction (e.g. up or down). In one embodiment, heat pipe 2750B may be connected to heat sink base 270 at a first end in an area corresponding to an area of die 210; have a middle portion that is positioned in channel 2725 but not connected to heat sink base 270; and a third section connected to heat sink base portion 272 as the floating heat transfer surface.

Figure 9:
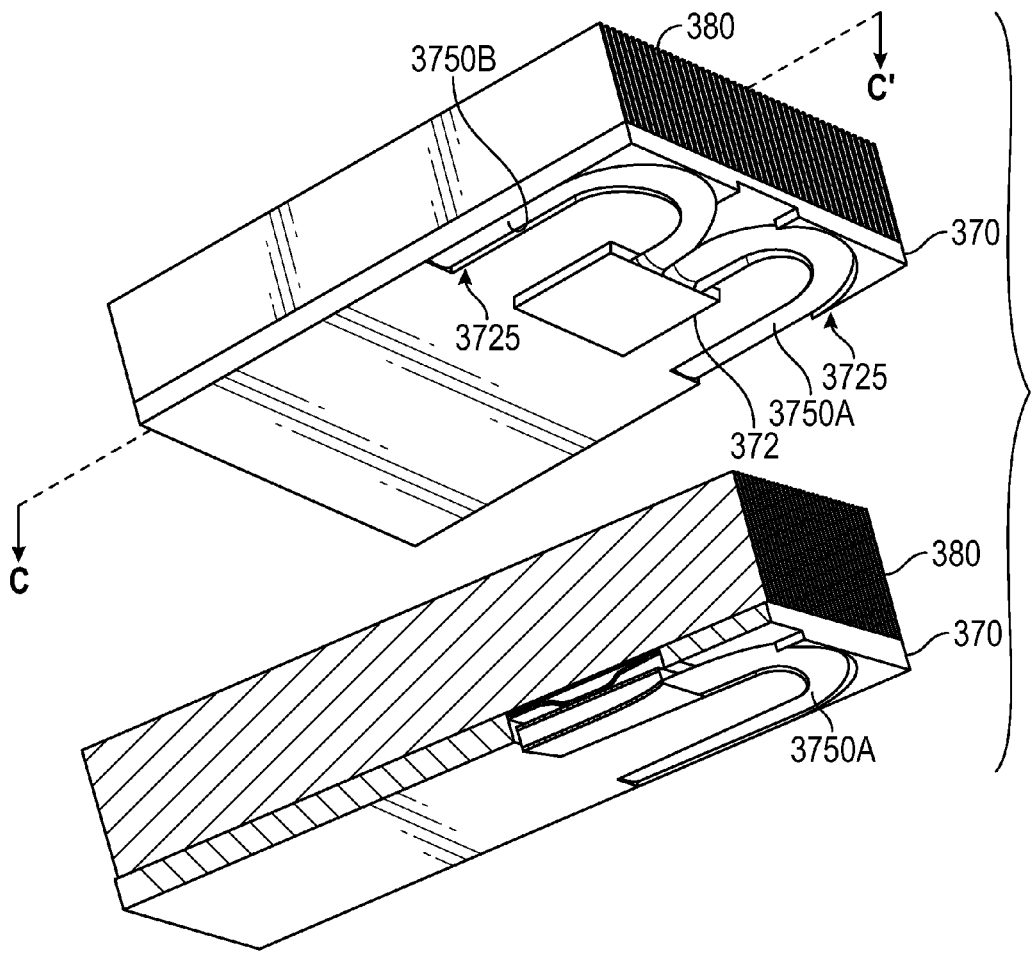
FIG. 9 shows a bottom perspective view of a heat sink including a floating heat transfer surface with multiple heat pipes connected to the heat transfer surface.

In one embodiment, heat sink base portion 272 (the floating heat transfer surface) can be selected for the companion component size and the heat removal required based on its thermal design power (TDP). For companion chips with low TDP (e.g., in the 20 watt to 30 watt range), a single heat pipe (heat pipe 2750B) can be utilized with a compressive load based on IHS surface area and a requirement of an individual die. For components with higher TDP, a floating heat transfer surface can be attached to multiple heat pipes so as not to exceed a maximum heat capability of each heat pipe. FIG. 9 shows a bottom perspective view of a heat sink including heat sink base 370 and fins 380. In this embodiment, heat sink base 370 includes channels 3725 (two channels) with heat pipes 3750A and 3750B respectively positioned therein. In this embodiment, heat sink base includes heat sink base portion 372 that can act as a floating heat transfer surface as described above. As illustrated in FIG. 9, in this embodiment, each of heat pipe 3750A and heat pipe 3750B is connected to heat sink base portion 372.

Figure 10:
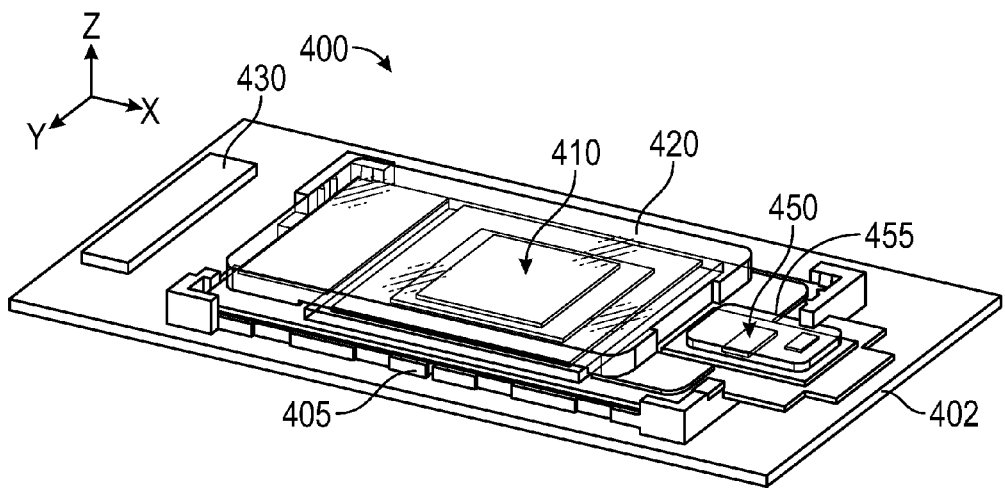
FIG. 10 shows a top perspective view of an assembly including a multi-chip package and voltage regulators.

FIG. 10 shows a top perspective view of another embodiment of a multi-chip package assembly. In this embodiment, assembly 400 includes substrate 402 on a surface of which is connected multi-chip package including substrate 405, die 410 and companion chip 450. Overlying die 410 is IHS 420 with, for example, a TIM1 therebetween and overlying companion chip 450 is IHS 455 with, for example, a TIM1 therebetween. Assembly also includes one or more voltage regulator components such as inductors 430 disposed on substrate 402. In this embodiment, a cooling solution will cool not only the multi-chip processor but also inductors 430.

Figure 11:
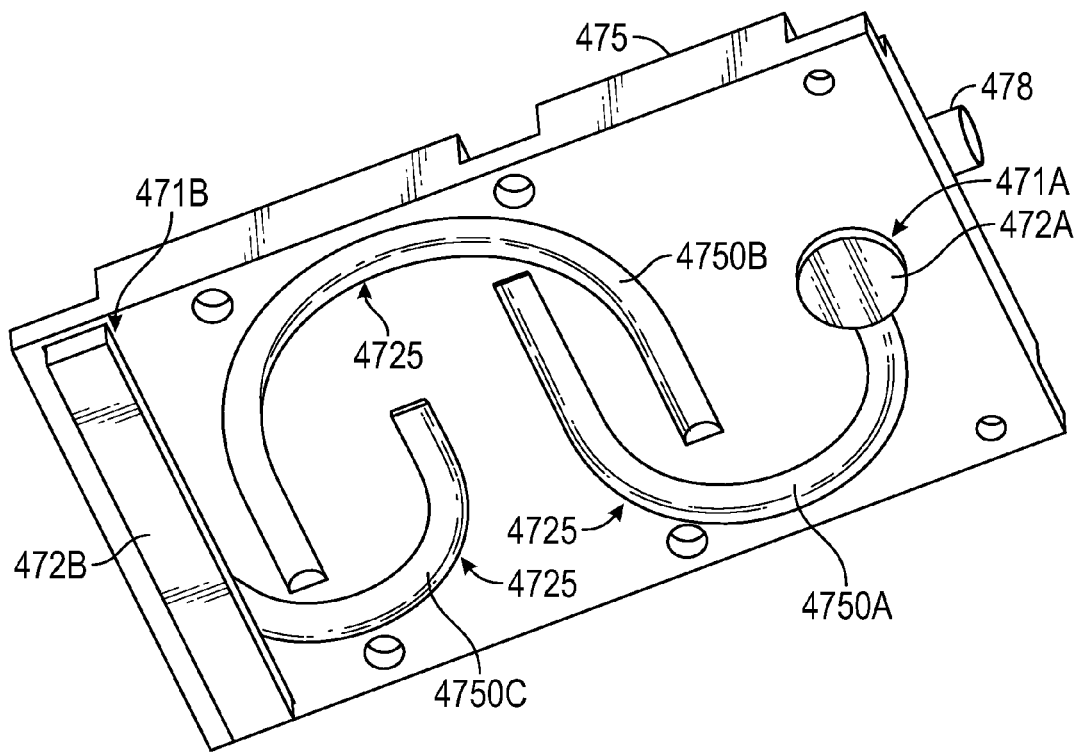
FIG. 11 shows a bottom perspective view of a heat sink operable for connection to the assembly of FIG. 10.
Figure 12:
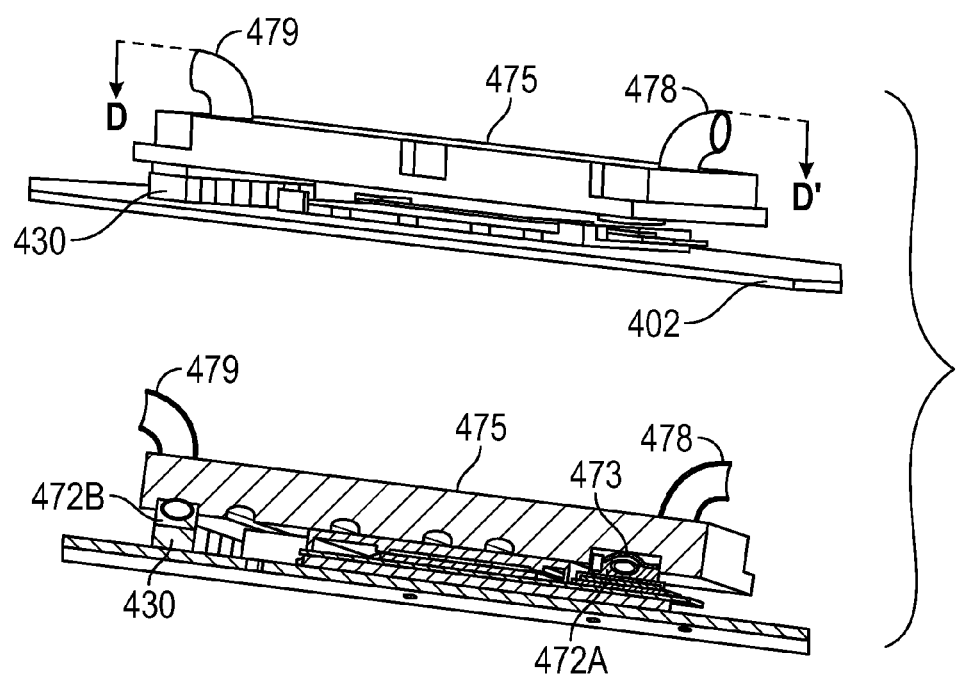
FIG. 12 shows a side perspective of an assembly of the assembly of FIG. 10 and the heat sink of FIG. 11 and a cross-section portion through line D-D'.

FIG. 11 shows a bottom side perspective view of a cooling solution that is a cold plate cooling solution with multiple floating heat transfer surface. FIG. 12 shows the cooling solution incorporated on assembly 400 described with reference to FIG. 10 with a lower portion showing a cross-section through lines D-D'. Referring to FIG. 11 and FIG. 12, the cooling solution includes cold plate 475 having a first surface including inlet conduit 478 for a coolant to be introduced into a body of the cold plate outlet conduit 479 for coolant removal. Cold plate 475 includes channels therein for the distribution of a fluid between inlet conduit 478 and outlet conduit 479.

In one embodiment, where cold plate 475 is connected to assembly 400, the cold plate is justified to IHS 420. As illustrated, companion chip 450 and its associated IHS 455 as well as inductors 430 are at a different Z-height than companion chip 450 and its associated IHS 455 and inductors 430. In this case, each of the companion chip and inductors have a z-height that is less than a z-height of die 410 and its associated IHS. Referring to FIG. 11, in one embodiment, a cold plate 475 includes floating heat transfer surfaces on a backside of the cold plate (a side opposite conduit 478 and conduit 479). FIG. 11 shows portion 472 positioned in a cavity 471 in an area of cold plate 475 corresponding to an area of companion chip 450 and portion 472B in cavity 471B of the cold plate in an area corresponding to an area of assembly 400 occupied by inductors 430. Each portion 472A and 472B may be biased away from cold plate 475 by a spring (spring 473) between the cold plate and portion 472A and portion 472B respectively as described above. FIG. 11 also shows heat pipes formed in channels in a base or backside of cold plate 475. Heat pipe 4750A, heat pipe 4750B and heat pipe 4750C are positioned in channels within the cold plate. Heat pipe 4750A is connected to portion 472A and can move in a z-direction with portion 472A. Heat pipe 4750C is connected to portion 472B and can likewise move in a z-direction with portion 472B. In this example, portion 472A is used to cool companion chip 450 of a multi-chip package assembly while portion 472B is used to cool an array of voltage regulator components located adjacent to the processor package.

Advantages of a single heat sink base with one or more adjustable heat transfer surfaces include a relatively cost efficient cooling solution design and maximizing cooling efficiency of multiple components by pooling (or sharing) a cooling solution volume of multiple components thereby increasing the overall power capability of each component and/or reducing the component operating temperatures. In addition, the floating heat transfer surfaces are self-adjusting to multiple height surfaces (multiple z-height possibilities) to minimize TIM1 and TIM2 and therefore increase a power capability and/or reduce temperature of a device. The configuration as described also allows continued use of existing TIM2 materials and minimizes the air flow pressure drop through a cooling solution, thus increasing overall air flow (e.g., efficient fan operation point) thereby maximizing thermal performance. The adjustable load per component further translates to a robust cooling solution.

Figure 13:
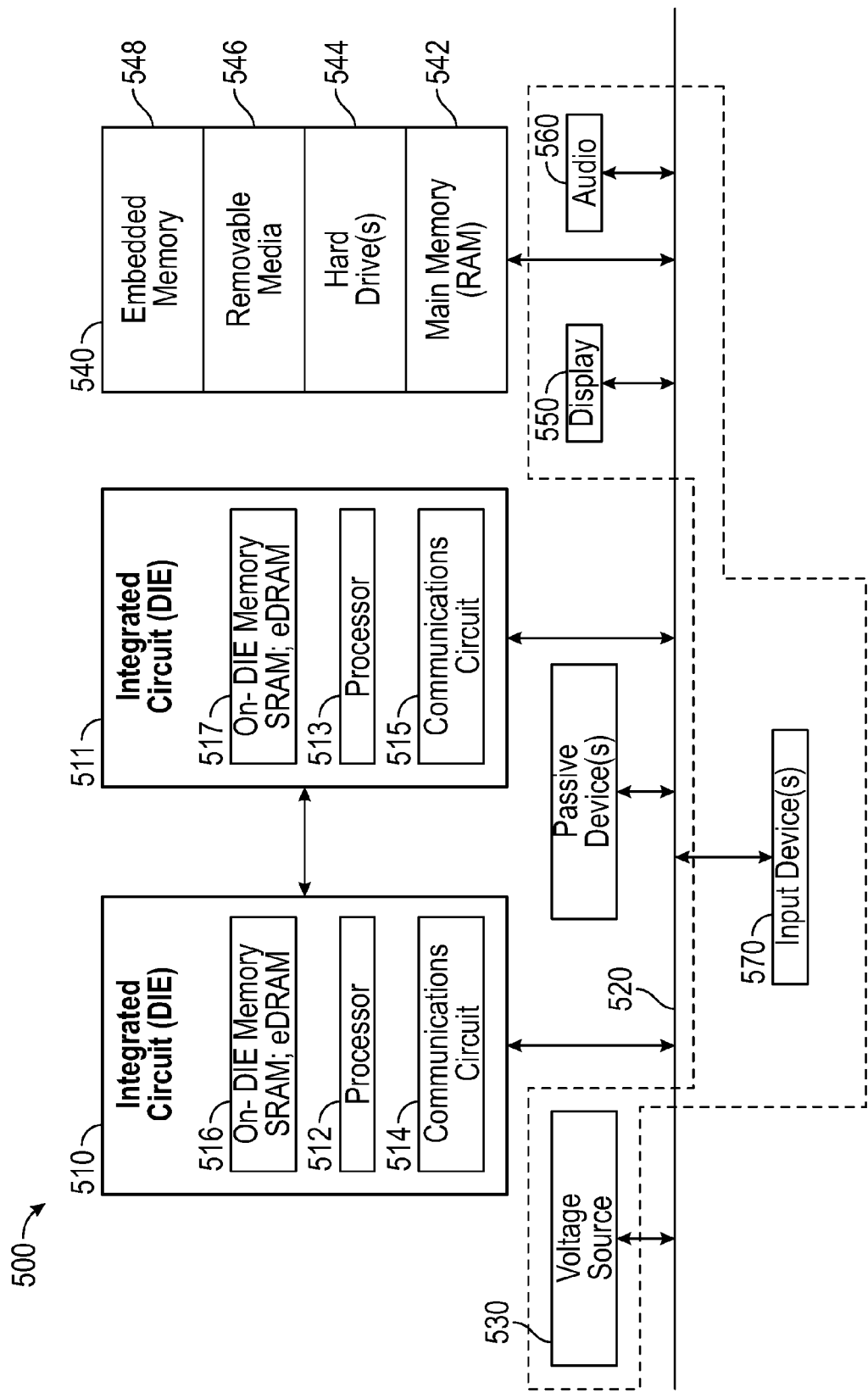
FIG. 13 illustrates an embodiment of a computing device.

Embodiments of the present disclosure may be implemented into a computing device using any suitable hardware and/or software to configure as desired. FIG. 13 schematically illustrates computing device 500 that includes an IC package assembly (e.g., multi-chip package) connected with a heat removal assembly as described herein, in accordance with some embodiments. Computing device 500 may be a desktop computer, a server system, a supercomputer, a high-performance computing system, a mobile device or a handheld reader.

In one embodiment, computing device 500 is a device that includes system bus 520 to electrically connect the various components of computing device 500. System bus 520 is a single bus or any combination of busses according to various embodiments. Computing device 500 includes voltage source 530 that provides power to integrated circuit 510. In some embodiments, voltage source 530 supplies current to integrated circuit 510 through system bus 520.

Integrated circuit 510 is electrically connected to system bus 520 and includes any circuit, or combination of circuits according to an embodiment. In one embodiment, integrated circuit 510 includes processor 512 that can be of any type. As used herein, processor 512 can include any type of circuit such as, but not limited to, a microprocessor, a microcontroller, a graphics processor, a digital signal processor or another processor. In one embodiment, static random access memory (SRAM) embodiments are found in memory caches of the processor. Processor 512 of computing device 500 may be packaged in an IC package assembly (e.g., multichip package) connected with a heat removal assembly as described herein. For example, processor 512 may be a die of a die package that is connected with a heat removal assembly as described herein and mounted on the circuit board (e.g., a motherboard). Other suitable configurations may be implemented in accordance with embodiments described herein. The term "processor" may refer to any device or portion of a device that processes electronic data from registers and/or memory to transform that electronic data into other electronic data that may be stored in registers and/or memory. Other types of circuits that can be included in integrated circuit 510 in, for example, a multichip package assembly are one or more of a custom circuit or an application-specific integrated circuit (ASIC), such as communications circuit 514 for use in wireless devices such as cellular telephones, smart phones, pagers, portable computers, two-way radios, and similar electronic systems, or a communications circuit for servers. In one embodiment, a multichip package assembly of integrated circuit 510 includes on-die memory 516 such as SRAM. In one embodiment, integrated circuit 510 includes embedded on-die memory 516 such as embedded dynamic random access memory (eDRAM).

In one embodiment, integrated circuit 510 is complemented with subsequent integrated circuit 511. Useful embodiments include dual processor 513 and dual communications circuit 515 and dual on-die memory 517 such as SRAM. In one embodiment, dual integrated circuit 510 includes embedded on-die memory 517 such as eDRAM. Devices of integrated circuit 511, in one embodiment, are packaged in an IC package assembly (e.g., multichip package) connected with a heat removal assembly as described herein.

In one embodiment, computing device 500 also includes external memory 540 that in turn may include one or more memory elements suitable to the particular application, such as main memory 542 in the form of RAM, one or more hard drives 544, and/or one or more drives that handle removable media 546, such as diskettes, compact disks (CDs), digital variable disks (DVDs), flash memory drives, and other removable media known in the art. External memory 540 may also be embedded memory 548 such as the first die in a die stack, according to one embodiment.

In one embodiment, computing device 500 also includes display device 550, audio output 560. In one embodiment, computing device 500 includes an input device such as controller 570 that may be a keyboard, mouse, trackball, game controller, microphone, voice-recognition device, or any other input device that inputs information into the computing device 500. In one embodiment, input device 570 is a camera. In one embodiment, input device 570 is a digital sound recorder. In one embodiment, input device 570 is a camera and a digital sound recorder.

EXAMPLES

Example 1 is an apparatus including a primary device and at least one secondary device coupled in a planar array to a substrate; a heat exchanger disposed on the primary device and on the at least one secondary device, wherein the heat exchanger includes at least one portion disposed over an area corresponding to the primary device or the at least one second device including a deflectable surface; and at least one thermally conductive conduit coupled to the heat exchanger and the at least one portion.

In Example 2, the heat exchanger of the apparatus of Example 1 includes a heat sink including an indivisible fin structure.

In Example 3, the heat exchanger of the apparatus of Example 1 or 2 includes a heat sink including an indivisible heat sink base.

In Example 4, the heat sink base of the apparatus of Example 3 includes a surface that defines a cavity, the apparatus further including a heat sink base portion in the cavity that defines the deflectable surface.

In Example 5, the heat sink base of the apparatus of Example 4 includes a first surface coupled to a fin structure and a second surface opposite the first surface, wherein the second surface defines the cavity.

In Example 6, the second surface of the apparatus of Example 5 defines at least one channel separate from the cavity, the apparatus further including a heat pipe disposed in the at least one channel, wherein the heat pipe extends into the heat base portion and is coupled to the heat sink base portion.

In Example 7, the heat pipe of the apparatus of Example 6 is coupled to the second surface of the heat sink base.

In Example 8, the heat pipe of the apparatus of Example 7 includes a first end and the first end is coupled to second surface of the heat sink base.

Example 9 is a system including a circuit board; a plurality of dice mounted on the circuit board; a heat exchanger positioned on the plurality of dice, the heat exchanger including at least one floating section operable to move in a direction toward or away from at least one of the plurality of dice; and at least one thermally conductive conduit disposed in a channel of the heat exchanger and connected to the at least one floating section.

In Example 10, the heat exchanger of the system of Example 9 includes a heat sink including an indivisible fin structure.

In Example 11, the heat exchanger of the system of Example 9 or 10 includes a heat sink including an indivisible heat sink base.

In Example 12, the heat sink base of the system of Example 11 includes a surface that defines a cavity, wherein a heat sink base portion is disposed in the cavity and defines the floating section.

In Example 13, the heat sink base of the system of Example 12 includes a first surface coupled to a fin structure and a second surface opposite the first surface, wherein the second surface defines the cavity.

In Example 14, the thermally conductive conduit of the system of Example 13 is coupled to the second surface of the heat sink base.

In Example 15, the thermally conductive conduit of the system of Example 14 includes a first end and the first end is coupled to second surface of the heat sink base.

Example 16 is a method including placing a heat exchanger on a multi-chip package, the heat exchanger including the heat exchanger including at least one floating section operable to move in a direction toward or away from at least one of the plurality of dice and at least one thermally conductive conduit disposed in a channel of the heat exchanger and connected to the at least one floating section; and coupling the heat exchanger to the multi-chip package.

In Example 17, the heat exchanger of the method of Example 16 includes a heat sink including an indivisible fin structure.

In Example 18, the heat exchanger of the method of Example 16 or 17 includes a heat sink including an indivisible heat sink base.

In Example 19, the heat sink base of any of the methods of Examples 16-18 includes a surface that defines a cavity, wherein a heat sink base portion is disposed in the cavity and defines the floating section.

In Example 20, a multi-chip package assembly is made by any of the methods of Examples 16-19.

Various embodiments may include any suitable combination of the above-described embodiments including alternative (or) embodiments of embodiments that are described in conjunctive form (and) above (e.g., the "and" may be "and/or"). Some embodiments may include one or more methods of removing heat from a multi-chip package and/or actions related to providing and/or fabricating a heat removal assembly as described herein. Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

The invention claimed is:

1. An apparatus comprising:
   a primary device and at least one secondary device coupled in a planar array to a substrate;
   a first heat exchanger disposed on the primary device and on the at least one secondary device, wherein the first heat exchanger includes at least one cavity disposed over an area corresponding to the primary device or the at least one secondary device, wherein the first heat exchanger comprises a first heat sink base;
   a second heat exchanger disposed in the cavity, wherein the second heat exchanger comprises a second heat sink base; and
   at least one thermally conductive conduit comprising a first portion coupled to the first heat sink base and a second portion disposed between the first heat sink base and the second heat sink base.

2. The apparatus of claim 1, wherein the first heat exchanger comprises a heat sink comprising an indivisible fin structure coupled to the first heat sink base.

3. The apparatus of claim 1, wherein the first heat sink base comprises an indivisible heat sink base.

4. The apparatus of claim 1, wherein the first heat sink base comprises a first surface coupled to a fin structure and a second surface opposite the first surface, wherein the second surface defines the cavity.

5. The apparatus of claim 4, wherein the second surface of the first heat sink base defines at least one channel separate from the cavity and the thermally conductive conduit comprises a heat pipe disposed in the at least one channel.

6. The apparatus of claim 5, wherein the heat pipe is coupled to the second surface of the first heat sink base.

7. The apparatus of claim 6, wherein the heat pipe comprises a first end and the first end is coupled to the second surface of the first heat sink base.

8. A system comprising:
   a circuit board;
   a plurality of dice mounted on the circuit board;
   a heat exchanger positioned on the plurality of dice, the heat exchanger comprising a first heat sink base and at least one floating section comprising a second heat sink base operable to move in a direction toward or away from at least one of the plurality of dice; and
   at least one thermally conductive conduit comprising a first portion disposed in a channel in the first heat sink base of the heat exchanger and a second portion connected to the at least one floating section and disposed between the first heat sink base of the heat exchanger and the second heat sink base of the at least one floating section.

9. The system of claim 8, wherein the heat exchanger comprises an indivisible fin structure coupled to the first heat sink base.

10. The system of claim 8, wherein the first heat sink base comprises an indivisible heat sink base.

11. The system of claim 10, wherein the first heat sink base comprises a surface that defines a cavity and the second heat sink base of the at least one floating section is disposed in the cavity.

12. The system of claim 11, wherein the first heat sink base comprises a first surface coupled to a fin structure and a second surface opposite the first surface, wherein the second surface defines the cavity.

13. The system of claim 12, wherein the thermally conductive conduit is coupled to the second surface of the first heat sink base.

14. The system of claim 13, wherein the thermally conductive conduit comprises a first end and the first end is coupled to second surface of the heat sink base.

* * * * *